(12) United States Patent
Wang

(10) Patent No.: US 7,863,972 B2
(45) Date of Patent: *Jan. 4, 2011

(54) SELF-CALIBRATION OF CONTINUOUS-TIME FILTERS AND SYSTEMS COMPRISING SUCH FILTERS

(75) Inventor: Zhenhua Wang, Zürich (CH)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

This patent is subject to a terminal disclaimer.

(21) Appl. No.: 12/168,588

(22) Filed: Jul. 7, 2008

(65) Prior Publication Data

US 2008/0272838 A1 Nov. 6, 2008

Related U.S. Application Data

(63) Continuation of application No. 10/526,194, filed as application No. PCT/IB03/03808 on Aug. 27, 2003, now Pat. No. 7,400,190.

(30) Foreign Application Priority Data

Sep. 5, 2002 (EP) .................................. 02102312

(51) Int. Cl.
 *H03K 5/00* (2006.01)
(52) U.S. Cl. ........................................ 327/553; 327/552
(58) Field of Classification Search .......... 327/551–559
 See application file for complete search history.

(56) References Cited

U.S. PATENT DOCUMENTS 5,239,367 A 8/1993 Sato 5,325,317 A 6/1994 Petersen et al.
5,594,383 A 1/1997 Tamba (Continued)

FOREIGN PATENT DOCUMENTS

EP 0 477 694 A2 4/1992

(Continued)

OTHER PUBLICATIONS

Wyszynski, A., et al., "Frequency and Phase Tuning of Continuous-Time Integrated Filters Using Common-Mode Signals," 1994 IEEE International Symposium on Circuits and Systems, Jun. 1994, pp. 269-272.

(Continued)

*Primary Examiner*—Dinh T. Le
(74) *Attorney, Agent, or Firm*—Timothy L. Boller; Seed IP Law Group PLLC

(57) ABSTRACT

A continuous-time filter system comprises a master control unit and a slave unit with one or more slave filters. The master control unit includes an integrator having circuit elements which match those elements of the slave filter that define the slave filter's time constant. The master control unit further includes a voltage comparator connected to an output of the integrator, the voltage comparator providing an output frequency signal, and a phase frequency comparator providing a control signal as an output signal, the phase frequency comparator receiving said output frequency signal and a reference frequency signal as input signals. The slave unit includes said at least one slave filter, the slave filter having a control signal input for receiving said control signal thus allowing to calibrate the slave filter's transfer function by influencing the slave filter's time constant.

21 Claims, 5 Drawing Sheets

U.S. PATENT DOCUMENTS

| | | |
|---|---|---|
| 5,621,355 A | 4/1997 | Williams et al. |
| 5,650,950 A | 7/1997 | Siniscalchi et al. |
| 5,912,583 A | 6/1999 | Pierson et al. |
| 6,084,465 A | 7/2000 | Dasgupta |
| 6,100,766 A | 8/2000 | Segawa et al. |
| 6,111,467 A | 8/2000 | Luo |
| 6,112,125 A | 8/2000 | Sandusky |
| 6,140,867 A | 10/2000 | de Micheli et al. |
| 6,172,569 B1 | 1/2001 | McCall et al. |
| 6,262,624 B1 * | 7/2001 | Tsinker ............... 327/553 |
| 6,304,135 B1 | 10/2001 | Muza |
| 6,326,838 B1 | 12/2001 | Kimura et al. |
| 6,519,008 B1 | 2/2003 | Kattner et al. |
| 7,019,586 B2 | 3/2006 | Dong |
| 7,403,063 B2 * | 7/2008 | Tu et al. ............... 327/552 |
| 2002/0015461 A1 | 2/2002 | Propp et al. |

FOREIGN PATENT DOCUMENTS

| | | |
|---|---|---|
| EP | 0 561 099 A1 | 9/1993 |
| EP | 0 663 719 A2 | 7/1995 |
| EP | 0 663 719 A3 | 7/1995 |
| EP | 0 663 719 B1 | 7/1995 |
| EP | 0 561 099 B1 | 9/1995 |

OTHER PUBLICATIONS

Laber, C. et al., "A 20-MHz Sixth-Order BiCMOS Parasitic-Insensitive Continuous-Time Filter and Second-Order Equalizer Optimized for Disk-Drive Read Channels," IEEE Journal of Solid-State Circuits 28(4):462-470, Apr. 1993.

Nishio, K. et al., "A Realization of Monolithic Variable Integrators and Their Application to Automatically Tunable High-Frequency Active Filters," Electronics and Communications in Japan, Part 2, 71(8):32-42, 1988.

* cited by examiner

SELF-CALIBRATION OF CONTINUOUS-TIME FILTERS AND SYSTEMS COMPRISING SUCH FILTERS

RELATED PATENT DOCUMENTS

This patent document is a continuation under 35 U.S.C. §120 of U.S. patent application Ser. No. 10/526,194 filed on Mar. 1, 2005 now U.S. Pat. No. 7,400,190, which is a 35 U.S.C. §371 national stage entry of International Application No. PCT/IB2003/003808 filed on Aug. 27, 2003, which claims priority benefit under 35 U.S.C. §119 of European Patent Application No. 02102312.2 filed on Sep. 5, 2002, to which priority is also claimed here.

The present invention concerns the calibration of continuous-time filters, and in particular continuous-time Gm-C and RC-filters.

Continuous-time filters have found increasing commercial applications in telecommunications, video-signal processing, disk drivers, computer communication networks and so forth. A continuous-time filter can be favorably implemented with transconductors and capacitors. Such a filter is called Gm-C filter. If realized using passive resistors and capacitors, the respective filter is called RC-filter.

The frequency characteristics of a filter is determined by the product of the resistance R and the capacitance C in an RC-filter. In a Gm-C filter, the time constant is given by $C/G_m$.

There is prior art concerning the calibration of the transconductance Gm alone. Such calibrations schemes are not applicable to continuous-time filters, which represent a vast majority of circuits using transconductances. According to the prior art documents listed below, the calibration is achieved by matching the output current of the transconductance—to the input of which a DC signal is applied—to a reference current. A matching error is then used to tune the transconductance:

U.S. Pat. No. 5,621,355
U.S. Pat. No. 5,650,950
U.S. Pat. No. 5,912,583
U.S. Pat. No. 6,140,867
U.S. Pat. No. 6,172,569
EP 561 099

All these prior art documents use the same principle of calibration, while there are certain differences among these documents that only lie in the ways the reference current is being generated. There are also some minor differences in the implementation details. U.S. Pat. No. 5,621,355, for example, requires a precision external resistor, while others documents require a precision current digital-analog converter (DAC). According to U.S. Pat. No. 5,621,355 the reference current is generated by applying an accurate DC voltage, while in U.S. Pat. No. 5,650,950, U.S. Pat. No. 5,912,583, U.S. Pat. No. 6,140,867, and U.S. Pat. No. 6,172,569 the desired transconductance Gm is mapped to a reference current by a digital signal applied to the DAC. EP 561 099 proposes to use a polarization circuit to do the calibration.

There are application limitations for these prior art schemes. The requirement of an external precision resistor, a precision DAC, and a precision DC voltage make these schemes expensive. Another disadvantage is that the calibration is done at DC.

The scheme presented in U.S. Pat. No. 5,621,355 is actually a modification of a previous publication by Laber and Gray in IEEE Journal of Solid-State Circuits, Vol. 28, No. 4, April 1993, where only Gm is tuned. The modification was to replace the external resistor by a switched-capacitor acting as a resistor. As above, the calibration is to match the transconductance Gm to that of an external precision resistor by forcing the same voltage over both the resistor and the input of the transconductor Gm.

Yet another approach is disclosed in U.S. Pat. No. 6,304,135. According to U.S. Pat. No. 6,304,135, Gm is determined by an external resistor $R_{ext}$ and C is calibrated iteratively by compensating an on-chip calibrating capacitor with a very complex variable current source. A special algorithm is required to perform the iterative calibration. The variable current source proposed in U.S. Pat. No. 6,304,135 is complex. The calibration approach only works with the one transconductor type described in U.S. Pat. No. 6,304,135 and the approach is not applicable to other types of transconductors.

The calibration scheme presented in U.S. Pat. No. 6,084,465 works in a different manner. After a discharge is completed, one capacitor is charged by the master Gm within a certain time interval, the capacitor voltage at the end of this time interval then being compared with a fixed voltage. An error signal is then used to tune the Gm. In order to preserve this voltage while the capacitor is in discharge, another capacitor with switches is required. Both capacitors have to be perfectly matched which is not possible in practice thus resulting in errors. It is another disadvantage of this scheme, that a very complex state machine is required to control various switches. Furthermore, the whole calibration takes quite long.

A variation of the scheme presented in U.S. Pat. No. 6,084,465 is described in U.S. Pat. No. 6,111,467. This scheme is complex too, and it requires many switches and switching activities.

A very complicated and complex scheme is described in U.S. Pat. No. 6,112,125. The tuning is achieved by injecting a reference signal and monitoring the phase of a filter output.

The big advantage of a Gm-C filter over an RC-filter is the tuning ability of the filter via the transconductance $G_m$. However, both filter types suffer from process variations, thus limiting them only to non-critical applications.

Self calibration is an effective technique to surmount the problem and to realize more accurate continuous-time filters. Almost all known calibration techniques are based on the so-called master-slave principle. Both the slave filter, which processes the signal, and the master control block, which may be either comprise a voltage-controlled oscillator (VCO) or a voltage controlled filter (VCF), are made of identical transconductors controlled by a voltage. After the master control block, which is put within a phase-locked loop (PLL), is calibrated or tuned to a reference frequency of the PLL, its time constant ($\tau$) is tuned to the correct value. If the transconductors and capacitors in both master and slave are perfectly matched, the slave filter is also tuned to its desired characteristics. It is a disadvantage of conventional calibration techniques that a VCO or VCF requires at least two integrators, i.e., at least two transconductors and some capacitors. The tuning precision is relative poor because of the internal mismatches. In addition, the power consumption and the required area are considerably large.

A basic lossless Gm-C integrator 10 is illustrated in FIG. 1. The Gm-C integrator 10 comprises a transconductor 13 having a voltage input 12. Another input 15 is connected to ground. A capacitor C is arranged between the transconductor output 14 and ground. The integrator's transfer function is given by $$\frac{V_0}{V_{in}} = \frac{1}{s\tau} \quad (1)$$

where $\tau$ is the time constant of the integrator 10, determined by the capacitor C
and the transconductance $G_m$ of the transconductor 13:

$$\tau = \frac{C}{G_m} \quad (2)$$

In an RC filter, the time constant $\tau$ is the product of R and C. In an integrated Filter, both $G_m$ or C are subject to process variations and so are the characteristics of the whole filter, too. It is an advantage of Gm-C filter, that $G_m$ is controllable. $G_m$ can be controlled by varying the voltage $\upsilon$ (herein also referred to as control signal) that is applied to an input II of the transconductor 13. By an appropriate arrangement Gm-C filters can be made to be self calibrated.

Currently, continuous-time Gm-C filters or RC filters are confined only to non-critical applications due to process variations, if no special measures are taken.

It is another object of the present invention to provide filter systems that avoid or reduce disadvantages of known filter systems.

It is an object of the present invention to provide a scheme for flexible calibration of continuous-time Gm-C filters and RC-filters.

SUMMARY

These and other objectives are achieved by the present invention which provides filter systems according to claim 1 and implementations, according to claim 15, using such filter systems.

Advantageous implementations are claimed in the dependent claims 2 through 14.

This proposal discloses a technique that overcomes all of the above mentioned problems by using just one transconductor or resistor and one capacitor in the master control unit. Other aspects of the invention will be apparent from and elucidated with reference to the embodiment(s) described hereinafter.

BRIEF DESCRIPTION OF THE DRAWINGS

For a more complete description of the present invention and for further objects and advantages thereof, reference is made to the following description, taken in conjunction with the accompanying drawings, in which:

FIG. 2A illustrates the principle of the proposed self calibration scheme. It is based on the master-slave principle. However, the master is neither a VCO nor a VCF, as in prior art systems. Instead, it comprises an integrator 20 similar to the integrator 10 shown in FIG. 1. According to the invention, a DC voltage $V_B$ is applied to the input 22 of a transconductor 23, which is followed by a comparator 25. A capacitor C is arranged between the transconductor output 24 and ground. The voltage $V_C$ over the capacitor C can be expressed as $$V_C = \int \frac{G_m V_B}{C} dt = \frac{V_B t}{\tau} \quad (3)$$

Figure 1:
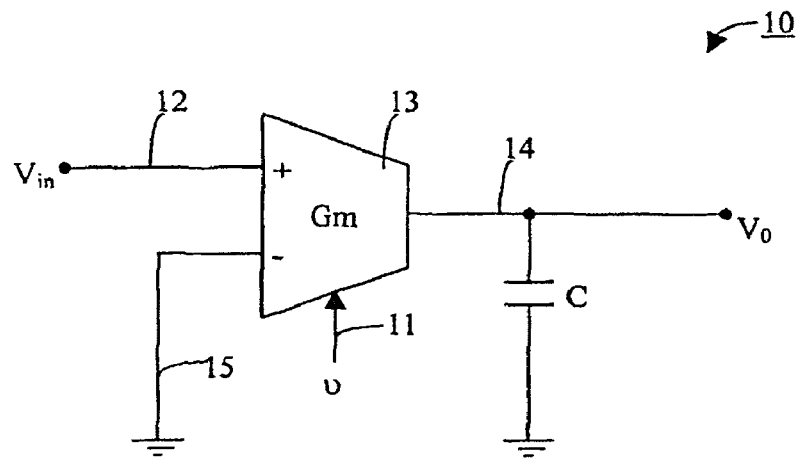
FIG. 1 is a schematic block diagram of a conventional lossless Gm-C integrator.
Figure 2A:
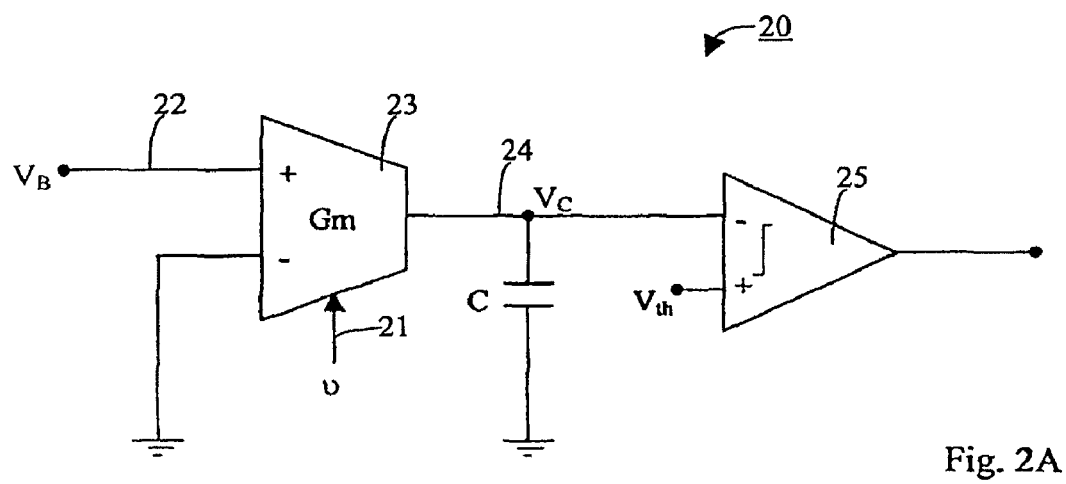
FIG. 2A is a schematic block diagram of a master control block, according to the present invention.
Figure 2B:
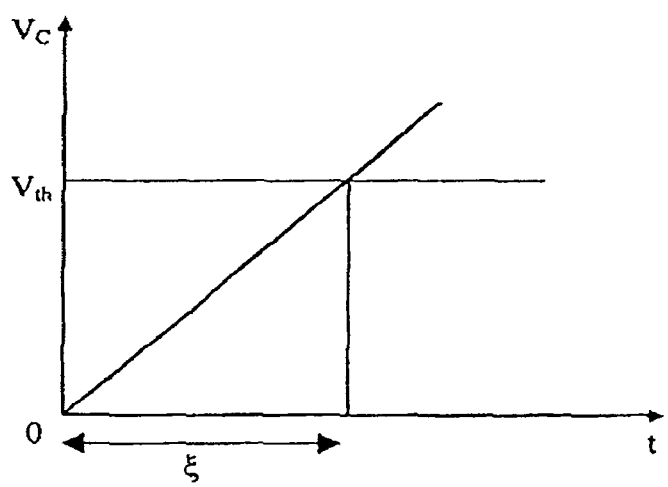
FIG. 2B is a graph giving the definition of $\xi$.

Referring to the graph in FIG. 2B, if the initial value of the voltage $V_C$ at the transconductor output 24 is zero, the time t that it takes for $V_C$ to reach the threshold level $V_{th}$ of the comparator 25 is given by $$\xi = \tau V_{th}/V_B \quad (4)$$

Rewriting the above equation yields the time constant of interest $$\tau = \xi V_B/V_{th} \quad (5)$$

Therefore, the time constant X of a salve filter, defined in eq. (2), can be calibrated or tuned either by varying $V_{th}$, or $V_B$, or $\xi$, or any combination of theses parameters. Defined in FIG. 2B, the parameter $\xi$ is a time quantity and can be made very accurate in a way as presented below.

Figure 3:
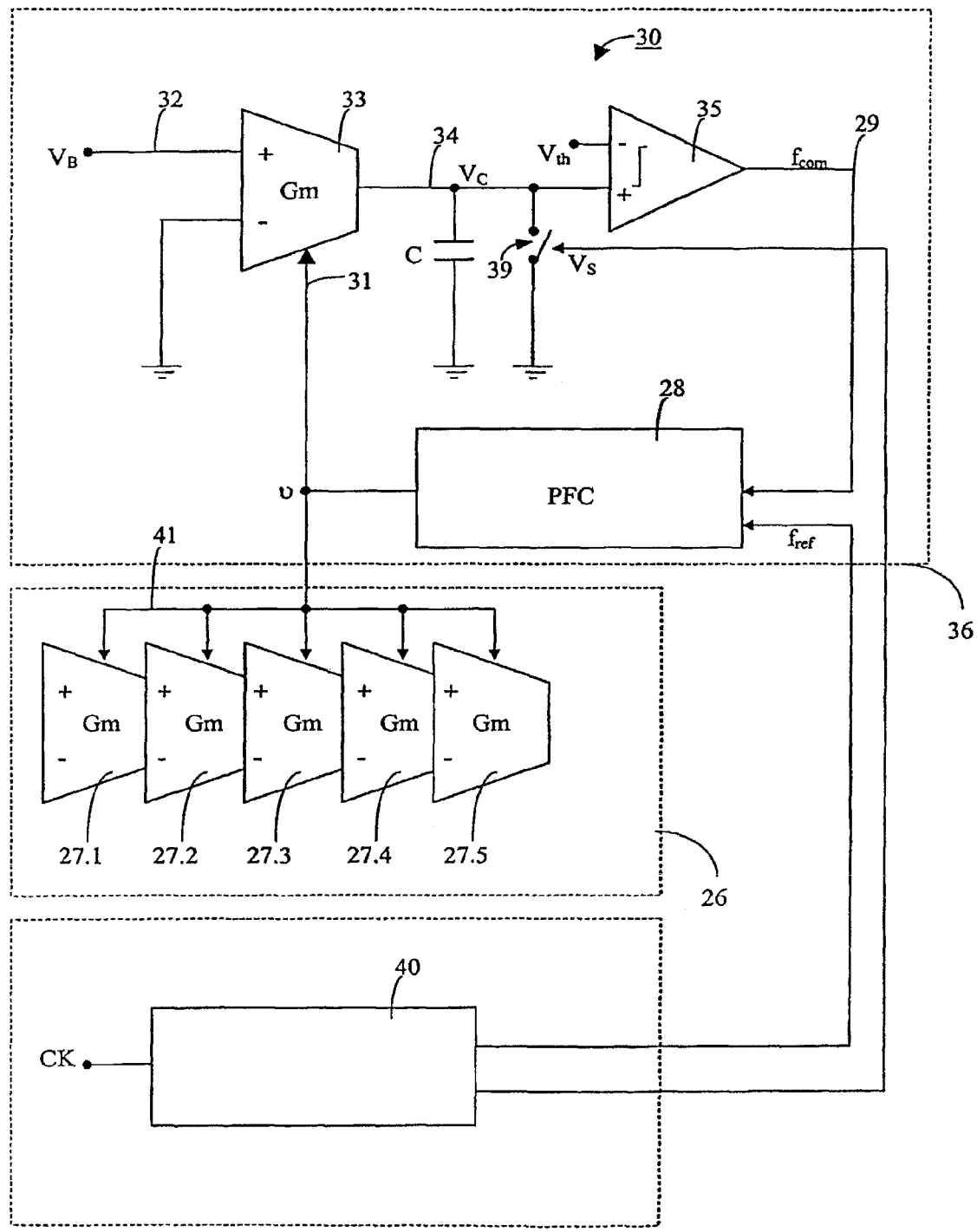
FIG. 3 is a schematic block diagram of a filter system, according to the present invention.

Based on the principle shown in FIGS. 2A and 2B, the block diagram of the proposed self calibration scheme for Gm-C filters is presented in FIG. 3, where the capacitors in the slave filters 27.1-27.5 are not shown. In addition to the integrator 30, the capacitor C, the transconductor 33, and the comparator 35, the master control block 36 comprises a phase-frequency comparator (PFC) 28, and a switch 39, controlled by the signal $V_S$. The switch 39 is arranged in parallel to the capacitor C. The transconductors 33 both in the master control block 36 and the slave filters 27.1-27.5 are controlled by the control signal $\upsilon$ of the phase-frequency comparator 28. Both signals $V_S$ and the reference frequency $f_{ref}$ are derived from a clock signal CK, as schematically indicated in FIG. 3. A logic circuit 40 is employed to provide the signals $V_S$ and $f_{ref}$. Details of an exemplary logic circuit 40 are given in FIG. 4A. The logic circuit 40 receives a clock signal CK as input signal. Such a clock signal is generally available on chip.

Figure 4A:
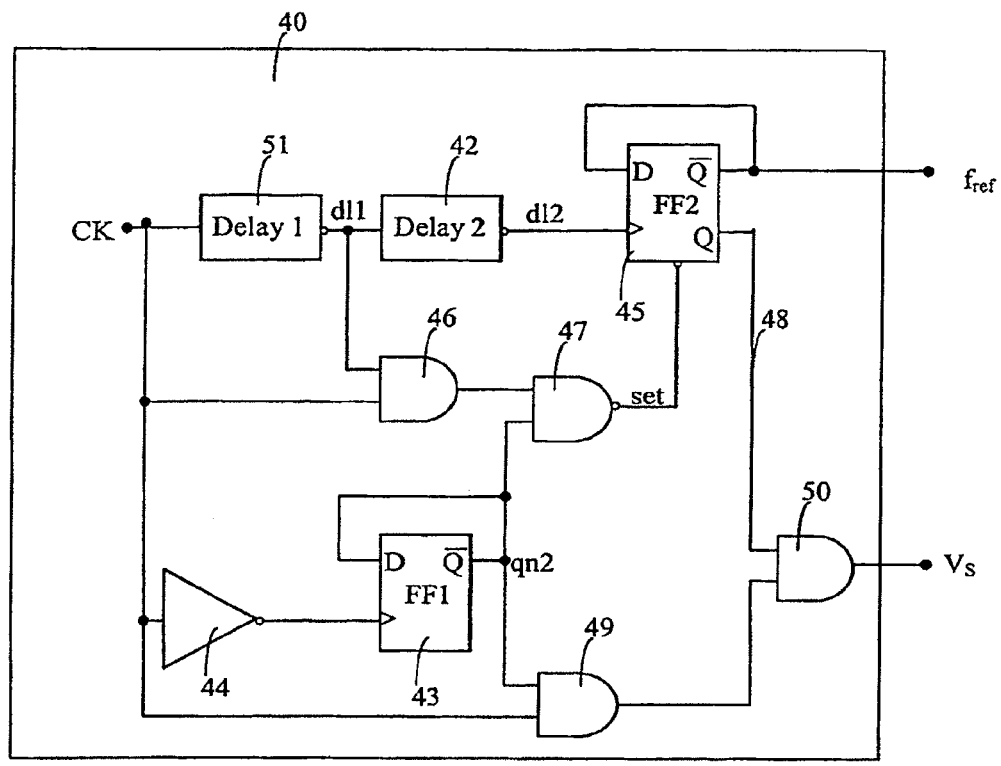
FIG. 4A is a schematic block diagram of a logic circuit, according to the present invention.

The operation of the logic circuit 40—as illustrated in FIG. 4A—is as follows: The input clock CK is first delayed by two delay elements 51 and 42, thus generating two delayed versions of the clock signal CK, designated as dl1, which is inverted, and dl2. The frequency of the input clock, $f_{CK}$, is divided by two by the flip-flop (FF1) 43, which is assumed to be a positive edge-triggered flip-flop. This is why its clock signal is first inverted by means of an inverter 44. The signal dl2 is applied as clock signal to a second preset flip-flop (FF2) 45. A set signal (set) is generated by a logic combination of CK, dl1 and qn2. In the present example, the logic combination is performed by the two gates 46 and 47. The Q-output 48 of the flip-flop (FF2) 45 goes logic high whenever the set signal (set) is logic low. Two gates 49 and 50 are employed at the output side of the logic circuit 40 in order to provide the output signal $V_S$ that is employed to control the switch 39. The interdependence of the signals is illustrated in the graphs of FIG. 4B.

Figure 4B:
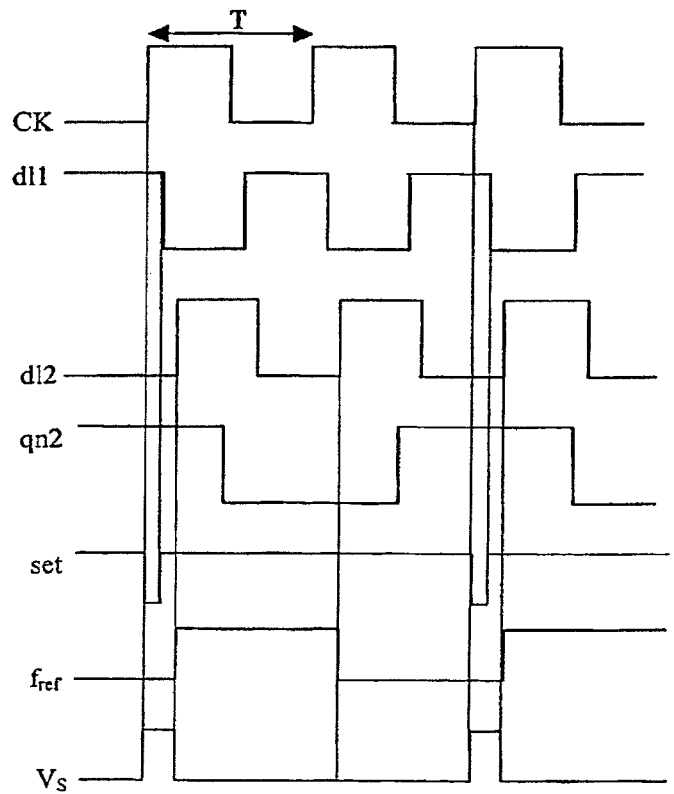
FIG. 4B is a graph showing various signals, according to the present invention.

Now back to FIG. 3. When the output signal $V_S$ is logic high, the switch 39 is closed and the capacitor C discharges. During this time, the reference frequency signal $f_{ref}$ is logic low (see the diagrams in FIGS. 4B and 6). As soon as $f_{ref}$ switches to logic high, $V_S$ goes back to logic low. The switch 39 is opened again and the transconductor 33 starts to charge the capacitor C. As long as $V_C$ is below the threshold voltage $V_{th}$ of the comparator 35 (cf. FIG. 6), the output signal $f_{com}$ at the output 29 of the comparator 35 remains logic high. The output signal $f_{com}$ switches to logic low as soon as $V_C$ exceeds the threshold voltage $V_{th}$ of the comparator 35. The PFC 28 (e.g., comprising a PFD and a loop filter) generates the control signal υ and applies it to the input 31 in such a way that the phase difference between $f_{ref}$ and $f_{com}$ becomes zero. In other words, the PFC 28 compares the phases and the frequencies of the input signals $f_{ref}$ and $f_{com}$. One has $$\xi = T \quad (6)$$

where T is the period of the input clock CK (cf. FIG. 4B). Substituting eq. (6) into eq. (5) yields $$\tau = TV_B/V_{th} \quad (7)$$

In other words, according to the present invention a filter system with self-calibration means is provided, as illustrated in FIG. 3. The system comprises a master control unit 36 and a slave unit with one or more slave filters 27.1-27.n. The master control unit 36 as such comprises an integrator 30 having circuit elements which match those circuit elements of the slave filter 27.1-27.n that define the slave filter's time constant τ. According to the present invention good matching is achieved, if the ratio of Gm of the master to Gm of a slave filter is constant. The same should apply to the ratio of the capacitance of the master to the capacitance of the slave filter. Furthermore, the master control unit 36 comprises a voltage comparator 35 being connected to an output 34 of the integrator 30. The voltage comparator 35 is employed to provide an output frequency signal $f_{com}$ at the output 29. There is a so-called phase frequency comparator (PFC) 28 that provides a control signal u as output signal. The phase frequency comparator 28 receives the output frequency signal υ and a reference frequency signal $f_{ref}$ as input signals. The slave unit comprises at least one slave filter 27.1-27.n. Each slave filter has a control signal input 41 for receiving the control signal u that allows to calibrate the slave filter's transfer function by influencing the slave filter's time constant τ. In FIG. 3, an embodiment is shown where the transfer functions of all five slave filters 27.1-27.n are calibrated by a common control signal υ.

According to the invention, the time constant r is calibrated by tuning $G_m$. This is done by periodically charging the capacitor C of the master control block 36 within a certain time interval of the clock signal CK. The comparator 35 is employed to compare the voltage $V_C$ over this capacitor C with a predefined voltage $V_{th}$, thus generating a periodic signal $f_{com}$. By using a PLL, the time constant τ to be tuned can be made to be equal to the period T of the clock signal CK. This is very convenient in practice. The time constant r of a large range can be calibrated by adjusting the clock frequency $f_{CK}$.

Figure 5:
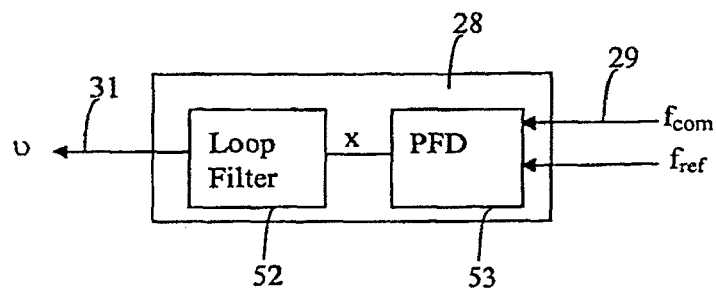
FIG. 5 is a schematic block diagram of a phase frequency comparator (PFC), according to the present invention.
Figure 6:
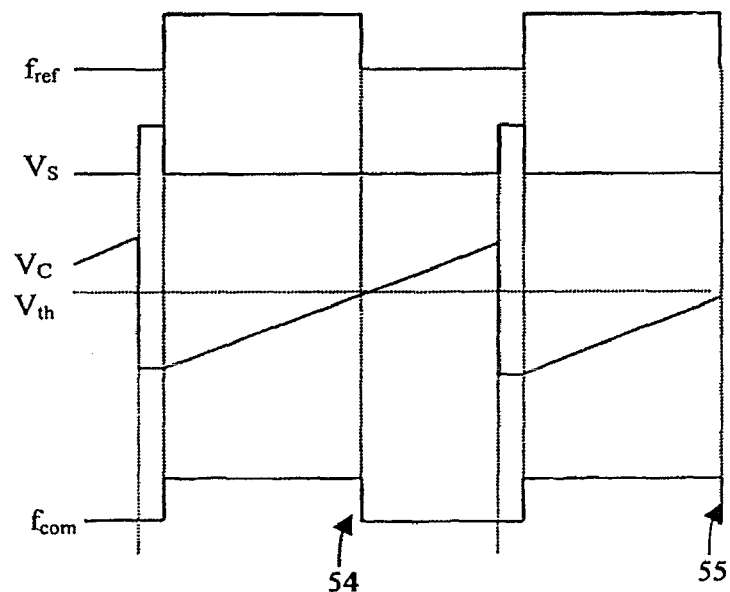
FIG. 6 is a graph showing other signals, according to the present invention.

Details of a phase frequency comparator 28 are illustrated in FIG. 5. The PFC 28 may comprise a loop filter 52 having an output 31 and providing the control signal υ as output signal at this output 31. The phase frequency comparator 28 may further comprise a phase frequency detector (PFD) 53 arranged in front of the loop filter 52. The phase frequency detector 53 has two inputs. It receives the output frequency signal $f_{com}$ and a reference frequency signal $f_{ref}$ as input signals. In the present embodiment, the PFD 53 is designed to operate on the falling edges 54 and 55 of the output frequency signal $f_{com}$ and the reference frequency signal $f_{ref}$ as indicated in the graph of FIG. 6. An error signal x representing the phase difference between the output frequency signal $f_{com}$ and the reference frequency signal $f_{ref}$ is being fed by the phase frequency detector 53 to the loop filter 52 in order to enable the loop filter 52 to provide the control signal υ as output signal. The graph of FIG. 6 gives further details about the timing and the self calibration according to the present invention.

According to known calibration techniques, a VCO or VCF in the master control unit is tuned to the reference frequency of a PFD. By contrast, the time constant τ presented in connection with the present invention depends on three circuit parameters: the input DC voltage $V_B$ at the input 32, the threshold voltage $V_{th}$ of the comparator 35, and the period T of the input clock signal CK, as expressed by eq. (7). According to the present invention, there is, therefore, a high degree of freedom and flexibility in calibrating Gm-C filters: Varying one, two, or even all three circuit parameters $V_B$, $V_{th}$, T simultaneously. This is one of the most salient features the inventive calibration scheme possesses. Consider the case of varying just one circuit parameter:

1) Timing the $G_m$ by the input clock frequency $f_{CK}$ while keeping $V_{th}$ and $V_B$ unchanged. For this calibration strategy, the time constant τ is tuned by varying the clock frequency $f_{CK}$, which is the reciprocal of the input clock period T. As a result, the time constant τ is tuned to the product of the input clock period T and the $V_{th}$ to $V_B$ ratio, as given in eq. (7). Particularly, if $V_{th}=V_B$, one obtains $$\tau = T \quad (8)$$

Similarly, if $V_{th}=2V_B$, one has r=T/2 and if $V_{th}=V_B/2$, τ=2T, etc.

From eq. (8) it is apparent that this calibration strategy offers the highest calibration accuracy, which is the same as that of the input clock, and this accuracy maintains over the entire tuning range. Also τ=T makes it very attractive in practice.

2) The time constant τ can be made proportional to $V_B$ if $V_{th}$ and $f_{ref}$ are kept unchanged. In this case, the available tuning range may be limited by the input range of the transconductor 33.

3) The time constant τ can be made inversely proportional to $V_{th}$ if $V_B$ and $f_{ref}$ are left unchanged. This calibration strategy makes it possible to tune the time constant τ over a larger range by a smaller variation in $V_{th}$. To demonstrate this, a numeric example is considered. Assuming the default value for $V_B$ is 1V and the corresponding transconductance is $G_{m0}$, the following table is obtained:

| | | | | | |
|---|---|---|---|---|---|
| Calibration strategy 2) | Tuning voltage $V_B$ [V] | 1 | 2 | 4 | 8 |
| Calibration strategy 3) | Tuning voltage $V_{th}$ [V] | 1 | 0.5 | 0.25 | .125 |
| | $G_{m0}$ | $G_{m0}$ | $2 G_{m0}$ | $4 G_{m0}$ | $8 G_{m0}$ |

It is seen that in order to tune $G_m$ by a factor of 8, this calibration strategy requires $V_{th}$ to change only from 1 to 0.125=0.725V. By contrast, the calibration strategy 2) entails a varying range of as large as 7V.

According to the present invention, it is also possible to allow two or even all three circuit parameters to vary simultaneously to calibrate the Gm-C filter. This is particularly useful in applications where a wider tuning range is required.

In the following, the calibration of RC filters is addressed. So far the present specification was mainly targeted at Gm-C filters. The proposed calibration technique can be directly applied to RC filters, too. The only change is that one has to replace the transconductor in the master control block by a voltage-to-current converter (VCC). The purpose is to have a transconductance derived from a resistor of the same type as used in the slave RC filters.

Figure 7:
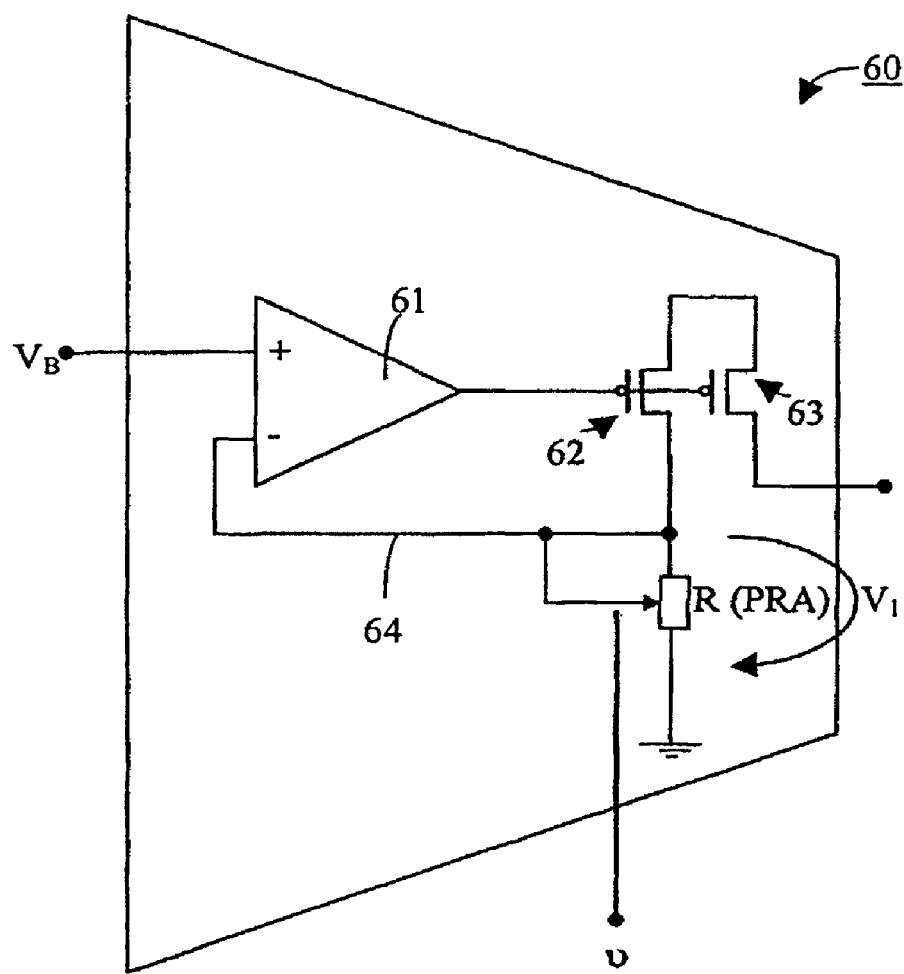
FIG. 7 is a schematic block diagram of a VCC that can be used in an RC filter, according to the present invention.

One possible embodiment of such a converter is depicted in FIG. 7. An operational amplifier 61 (op-amp) drives two matched pMOS transistors 62 and 63. Assuming an infinite amplifier gain, a feedback via a connection 64 will force the voltage $V_1$ over a resistor R to be equal to $V_B$, resulting in a transconductor of the value:

$$G_m = 1/R \quad (9)$$

Note that according to the present invention this VCC 60 is only needed in the master control block. FIG. 7 assumes that the resistors R in both the master control block and the slave filters are controlled by the voltages. In fact, the proposed calibration technique allows to vary either R or C. This is accomplished by replacing resistors or capacitors by so-called programmable resistor arrays (PRA) or programmable capacitor arrays. A programmable resistor array is an array or tree of resistors with a number of switches and a programmable capacitor array is an array or tree of capacitors with a number of switches.

While the time constant τ can be tuned/calibrated continuously with Gm-C filters,
the calibration of a RC filter is in steps. In binary programmable element arrays, the steps are determined by the smallest segment in the array.

The present invention is well suited for being used in a baseband integrated circuit (IC) designed for GSM transceivers, for example. In such a GSM transceiver, in the transmitter path a 3rd order Butterworth lowpass (LPF) filter is required to suppress the image components of the GMSK modulated signal after a transmitter digital-to-analog converter (DAC) at 4.33 MHz. Being an RC-type filter and no calibration or tuning being provided, the filter would be very vulnerable to process variations. As the resistance used can vary as large as −13% and +33%, and the capacitance +/−10%, it is quite difficult to achieve both sufficient image rejection and maximum flatness up to 100 kHz in the passband when using conventional approaches. If the time constant τ was too large, the 3 dB frequency would be shifted to a lower frequency, whereas this does not cause concern in the image rejection, it does for the baseband signal. Similarly, there might be concerns with the image rejection if the time constant τ was too small due to process variations. Furthermore, if the process had shifted, or if a new application or system was foreseen, a complete redesign would be inevitable.

Such a redesign can be avoided if the self calibration according to the present invention is employed. Adding self calibration capability to continuous-time filters targeted at critical applications can greatly reduce the time-to-market cycle, greatly reduce the costs, and greatly enhance the system performances.

As an example to verify the calibration scheme according to the present invention, a 3rd-order Gm-C filter has been designed, using the proposed calibration strategy 1). Simulation results indicate that the calibration process, without any optimization, takes only less than 9 cycles of the reference frequency $f_{ref}$ to complete. The time constants τ, both in the master control block and the slave filters, become error-free after the calibration.

Filter systems according to the present invention are based on a self calibration technique using only one transconductor and one capacitor. The master control block is not a VCO or VCF.

The invention is very well suited for accurate, integrated continuous-time filters, such as continuous-time Gm-C filters (using transconductors and capacitors) or continuous-time RC filters (using passive resistor and capacitors).

The invention offers a high degree of freedom and flexibility in choosing a calibration strategy. The circuits proposed are robust and the calibration is efficient and can be done with high precision. It is a further advantage that no external elements are required. The inventive scheme is very attractive for low-cost integration. There are no application limitations at all.

Filter system according to the present invention are based on the so called master-slave principle.

It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable subcombination.

In the drawings and specification there has been set forth preferred embodiments of the invention and, although specific terms are used, the description thus given uses terminology in a generic and descriptive sense only and not for purposes of limitation.

What is claimed is:

1. A continuous-time filter system comprising:
   a logic unit configured to supply a reference frequency signal based on a clock signal;
   a master control unit, the master control unit including:
     an integrator having a transconductor and a capacitor,
     a voltage comparator having a first input configured to receive a variable threshold voltage, a second input coupled to an output of the integrator, and an output configured to provide an output frequency signal, and
     a phase frequency comparator having a first input coupled to the output of the voltage comparator to receive the output frequency signal, a second input coupled to a first output of the logic unit to receive the reference frequency signal, and an output configured to provide a control signal; and
   a slave unit including an input coupled to the output of the phase frequency comparator and a slave filter configured to use the control signal to influence a time constant of the slave filter and therein facilitate calibration of a transfer function of the slave filter.

2. The system of claim 1, wherein the slave filter is an RC-filter and the control signal is a discrete signal leading to a calibration of the slave filter's transfer function in steps.

3. The system of claim 1, wherein the slave filter is a continuous-time Gm-C-filter and the control signal is a continuous signal.

4. The system of claim 1, wherein the slave filter is an integrated filter.

5. The system of claim 1, wherein the master control unit comprises only one transconductor and only one capacitor.

6. The system of one claim 1, wherein the phase frequency comparator comprises:

a loop filter configured to provide the control signal as output signal, and a phase frequency detector having an output coupled to an input of the loop filter, the phase frequency detector having a first input configured to receive said output frequency signal and a second input configured to receive the reference frequency signal, the phase frequency detector being configured to produce at the output of the phase frequency detector an error signal representing a phase difference between the output frequency signal and the reference frequency signal.

7. The system of claim 1, wherein the master control unit comprises a switch coupled in parallel to the capacitor.

8. The system of claim 1, wherein to the integrator includes an input configured to receive a DC voltage.

9. The system of claim 1, wherein the transconductor comprises a voltage-to-current converter that includes a programmable resistor array or a programmable capacitor array.

10. The system of claim 1, further embodied in a telecommunication system, video-signal processing system, or disk driver system.

11. A filter system comprising:
a master control unit including:
a transconductor having an output,
a capacitor coupled between the output of the transconductor and a voltage reference terminal
a first switch coupled in parallel with the capacitor between the output of the transconductor and the voltage reference terminal, the first switch having a control terminal,
a voltage comparator having a first input configured to receive a threshold voltage, a second input coupled to an output of the integrator, and an output configured to provide an output frequency signal, and
a phase frequency comparator having a first input coupled to the output of the voltage comparator to receive the output frequency signal, a second input coupled to receive a reference frequency signal, and an output configured to provide a control signal;
a slave unit including an input coupled to the output of the phase frequency comparator and a slave filter configured to use the control signal to influence a time constant of the slave filter; and
a logic unit having an output coupled to the control terminal of the first switch, the logic unit being configured to selectively short-circuit the capacitor by supplying a switch control signal to the control terminal of the first switch.

12. The system of one claim 11, wherein the phase frequency comparator comprises:
a loop filter configured to provide the control signal as output signal; and
a phase frequency detector having an output coupled to an input of the loop filter, the phase frequency detector having a first input configured to receive said output frequency signal and a second input configured to receive the reference frequency signal, the phase frequency detector being configured to produce at the output of the phase frequency detector an error signal representing a phase difference between the output frequency signal and the reference frequency signal.

13. The system of claim 11, wherein the logic unit has a second output configured to provide the reference frequency signal to the phase frequency comparator.

14. The system of claim 11, wherein the logic unit includes:
a first flip-flop configured to supply the switch control signal based on a clock signal, the first flip-flop having a set input;
a second flip-flop having an output configured to provide an intermediate signal based on a delayed version of the clock signal, the output of the second flip-flop being coupled to the set input of the first flip-flop; and
a logic gate having a first input coupled to an output of the first flip-flop, a second input coupled to the output of the second flip-flop, and an output configured to provide the reference frequency signal.

15. The system of claim 11, wherein the transconductor comprises a voltage-to-current converter that includes:
an opamp having first and second inputs and an output;
a second switch having a control terminal coupled to the output of the opamp and a conduction terminal feedback-connected to the second input; and
a programmable resistance coupled between the conduction terminal of the second switch and the voltage reference terminal, the programmable resistance having a control terminal coupled to the output of the phase frequency comparator.

16. A method, comprising:
charging a capacitor of an integrator using a transconductor output voltage of a transconductor of the integrator;
providing a comparator signal based on comparing the transconductor output voltage to a threshold voltage using a comparator;
frequency comparing the comparator signal with a reference frequency signal, and providing a control signal based on the frequency comparing; and
controlling a filter using the control signal, wherein controlling the filter includes using the control signal to influence a time constant of the filter; and
returning the transconductor output voltage to a value below the threshold voltage by periodically discharging the capacitor using a switch to selectively short-circuit the capacitor.

17. The method of claim 16, wherein the filter is an RC-filter, the control signal is a discrete signal and controlling the filter includes calibrating a transfer function of the filter using the control signal.

18. The method of claim 16, further comprising controlling a time constant of the integrator based on the control signal.

19. The method of claim 16, further comprising tuning a transconductance of the integrator by varying:
the threshold voltage; and/or
a DC voltage applied to an input of the integrator; and/or
a frequency of a clock signal used to generate the reference frequency signal.

20. The method of claim 16, further comprising tuning a transconductance of the integrator by varying a DC voltage applied to an input of the integrator while keeping unchanged the threshold voltage and the reference frequency signal.

21. The method of claim 16, further comprising tuning a transconductance of the integrator by varying the threshold voltage while keeping unchanged a DC voltage applied to an input of the integrator and the reference frequency signal.

* * * * *

UNITED STATES PATENT AND TRADEMARK OFFICE
CERTIFICATE OF CORRECTION

| | | |
|---|---|---|
| PATENT NO. | : 7,863,972 B2 | Page 1 of 1 |
| APPLICATION NO. | : 12/168588 | |
| DATED | : January 4, 2011 | |
| INVENTOR(S) | : Wang | |

It is certified that error appears in the above-identified patent and that said Letters Patent is hereby corrected as shown below:

Column 8
Claim 1, Line 42, "receive a variable threshold voltage, a second input" should read as, --receive a threshold voltage, a second input--.

Signed and Sealed this
Eighth Day of March, 2011

David J. Kappos
*Director of the United States Patent and Trademark Office*